United States Patent [19]
Lee et al.

[11] Patent Number: 6,106,259
[45] Date of Patent: Aug. 22, 2000

[54] TRANSFER MOLDING APPARATUS WITH A CULL-BLOCK HAVING PROTRUSION

[75] Inventors: Dae Sung Lee, Asan; Do Woo Lee, Cheonan; Hyun Woo Park, Asan, all of Rep. of Korea

[73] Assignee: Samsung Electronics Co., Ltd., Rep. of Korea

[21] Appl. No.: 09/160,523

[22] Filed: Sep. 24, 1998

[30] Foreign Application Priority Data

Dec. 16, 1997 [KR] Rep. of Korea ............... 97-69219

[51] Int. Cl.[7] ........................... B29C 45/02
[52] U.S. Cl. ............... 425/116; 264/272.17; 425/129.1; 425/544
[58] Field of Search ............... 264/272.17, 328.5; 425/116, 117, 129.1, 544

[56] References Cited

U.S. PATENT DOCUMENTS

| 4,708,613 | 11/1987 | Sera et al. | 425/544 |
| 5,123,826 | 6/1992 | Baird | 425/544 |
| 5,204,122 | 4/1993 | Konishi | 425/116 |
| 5,650,177 | 7/1997 | Kojima et al. | 425/121 |

FOREIGN PATENT DOCUMENTS

| 59-201429 | 11/1984 | Japan | 264/272.17 |
| 61-219613 | 9/1986 | Japan | 425/544 |
| 63-19218 | 1/1988 | Japan | 425/544 |

*Primary Examiner*—Robert Davis
*Attorney, Agent, or Firm*—Skjerven Morrill MacPherson LLP; David T. Millers

[57] ABSTRACT

A transfer molding apparatus with a specially designed cull-block can prevent the occurrence of defective molding caused by the air trapped inside the mold body. This cull-block has a cylindrical protrusion at the center of the cull-block and a circular sunken part along the perimeter of the protrusion. This new design prevents the air remaining behind the front of the fluid molding compound during molding process and finally, promotes the production of semiconductor device package free from molding defects.

21 Claims, 8 Drawing Sheets

TRANSFER MOLDING APPARATUS WITH A CULL-BLOCK HAVING PROTRUSION

BACKGROUND OF THE INVENTION

1. Field of the Invention

The present invention relates generally to a molding apparatus. More particularly, the invention relates to a molding apparatus for encapsulating semiconductor device packages, which can produce semiconductor packages free from molding defects.

2. Description of the Related Art

In a process for fabricating semiconductor device packages, a semiconductor device attached to a lead frame is encapsulated with a molding compound in order to provide a protection of the semiconductor device from external environments. The encapsulation is called as molding process.

Although the active surface of semiconductor device is coated with an oxide layer and an organic layer, the mechanical and chemical strength of these layers are not sufficient so that the encapsulation is needed to provide a proper protection of the active surface of semiconductor device, as well as to protect the electrical connections between the semiconductor device and the lead frame.

In general, transfer molding apparatuses using epoxy molding compounds are commonly employed for the molding process. The transfer molding process is more widely used than other encapsulation methods for encapsulating semiconductor devices because of its advantages such as good process stability and ease of mass-production. The conventional transfer molding apparatus will be explained below.

Figure 1A:
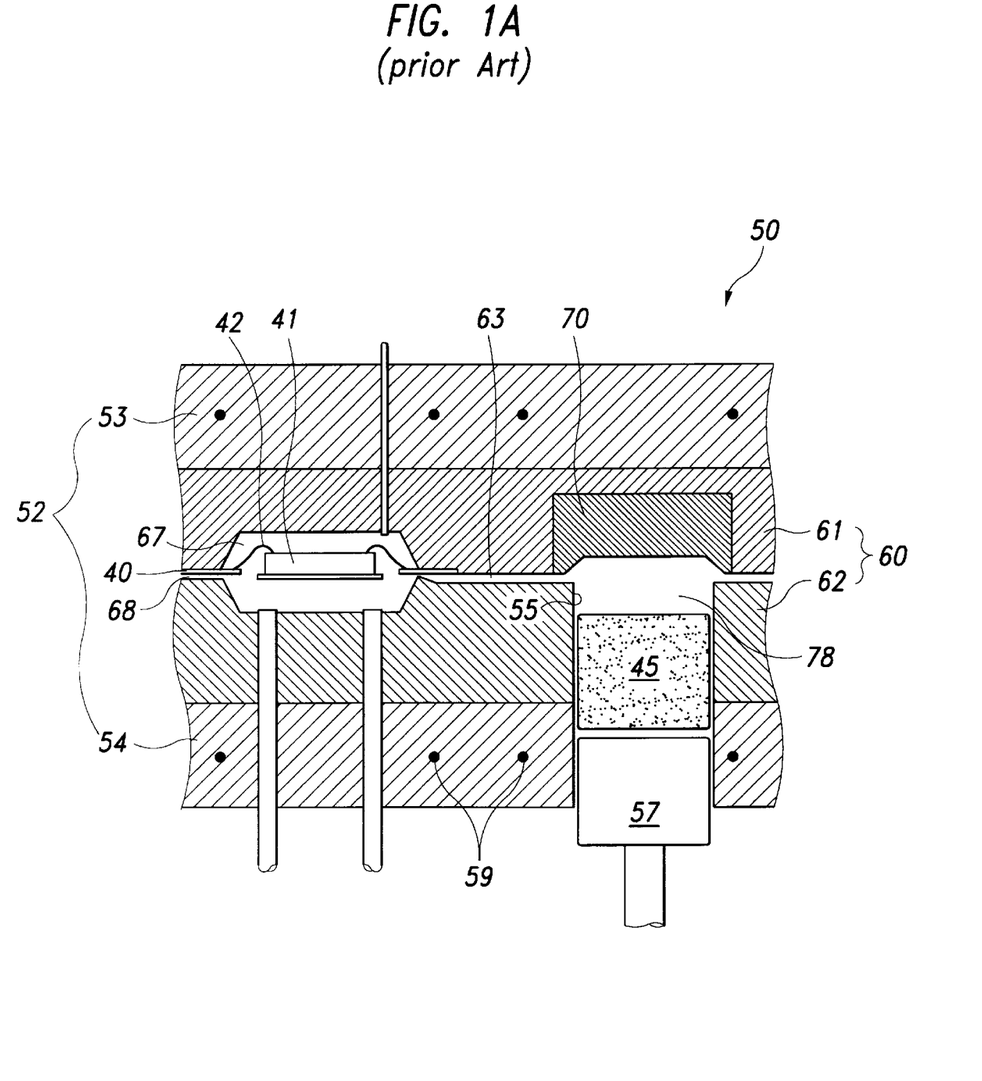
FIG. 1a to FIG. 1c show the steps of the molding process by using a conventional transfer molding apparatus.
Figure 1B:
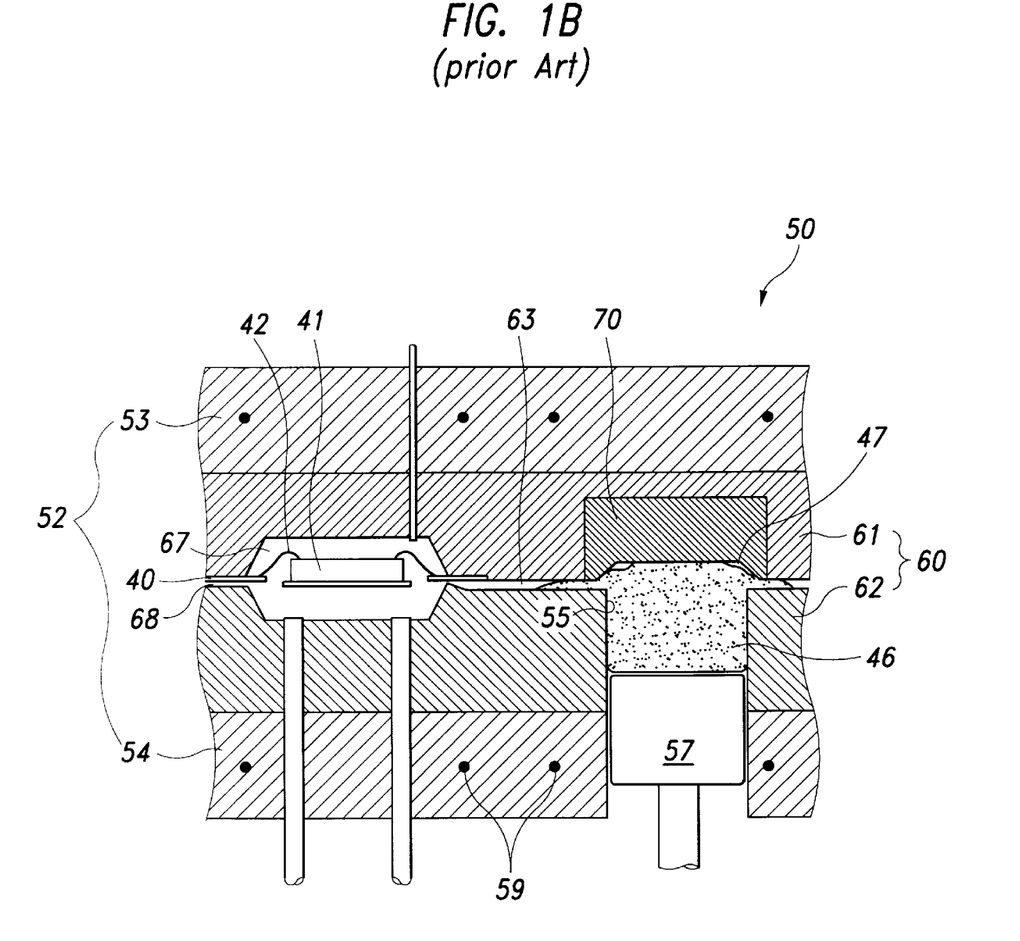
Figure 1C:
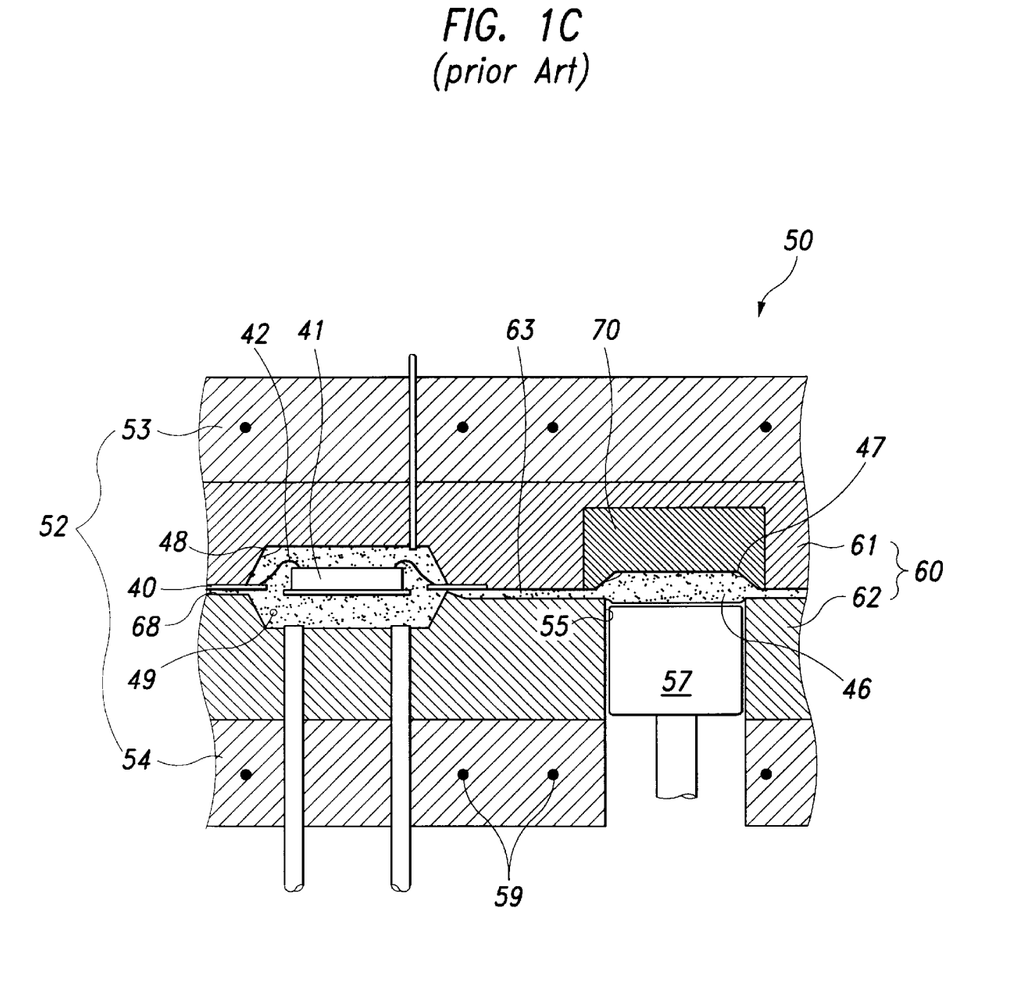

FIG. 1a to FIG. 1c show consecutive steps of a molding process using a conventional transfer molding apparatus. FIG. 1a shows the state before introducing molding compound into the runners and the cavities of the mold body, FIG. 1b shows the early state of the introduction of molding compound, and FIG. 1c shows the state after completing the introduction of molding compound into the mold body.

With reference to FIG. 1a, the conventional transfer molding apparatus 50 has a mold body 60 having an upper mold die 61 and a lower mold die 62. A semiconductor device 41 attached to a lead frame 40 is placed in a cavity 67 between the upper mold die 61 and lower mold die 62, and molding compound tablets 45 are loaded into a pot 55. The tablets 45 are heated and transformed to fluid molding compound 46. Then, as shown in FIG. 1b and FIG. 1c, this fluid molding compound 46 flows into the runners 63 and the cavity 67, when a plunger 57 moves upward and pushes the fluid molding compound 46. And, the fluid molding compound 46 is solidified by curing of the fluid molding compound 46, and provides a protection of the semiconductor device 41 from external environments.

The transfer molding apparatus 50 has a cull-block 70 in the upper mold die 61 to make the movement of the fluid resin 46 easier. The cull block 70 is located to face the pot 55 and the upper surface of the plunger 57.

The molding compound 45 is in the form of tablet when it is loaded into the pot 55 of the transfer molding apparatus 50. After being loaded into the pot 55, the molding compound tablet 45 is heated to a predetermined elevated temperature by supporting plates 52 that include a heater 59, and transformed to fluid molding compound 46. During this transformation, air contained in the tablet 45 remains in the fluid molding compound 46. Supporting plates 52 have two parts, upper plate 53 and lower plate 54.

When the fluid molding compound 46 flows into and fills the cavity 67 through the runner 63 by the movement of the plunger 57, the air may remain as air traps 48 at the interface between the surface of the cavity 67 and the fluid molding compound 46, or as voids 49 within the fluid molding compound 46. Although air vents 68 are made to provide an exit for the air in the fluid molding compound 46, sometimes the air traps 48 and the void are not completely eliminated.

After the fluid molding compound 46 is cured, the air traps 48 may result in the packages with defective surfaces, and the void 49 may cause package cracking later in surface mounting.

There is another significant source for the air included in fluid molding compound 46. The air within the space 78 between the cull-block 70 and the pot 55 is difficult to eliminate completely through the air vent 68 before the fluid molding compound 46 flows into the runner 63. In general, the fluid molding compound 46 occupies the runner 63 before the air in the space 78 are completely removed, leaving air gaps 47 on the surface of the cull-block 70, as shown in FIG. 1b. As the plunger 57 keeps on moving upward, the air gaps 47 are introduced belatedly into the runner 63 and the cavity 67, and produce air traps 48 and voids 49. That is, unless the cull-block 70 is designed properly, the air gaps 47 cannot be removed completely, resulting in a frequent occurrence of void formation or incomplete molding.

Moreover, a delayed elimination of the air in the fluid molding compound 46 through the air vent 68 may cause a clogging of the air vent 68 (known as 'film phenomenon'). This clogging of the air vent 68 may interfere further elimination of the air through the air vent 68, and cause a severe failure of the molding process.

SUMMARY OF THE INVENTION

An object of the present invention is to avoid the problems associated with the air included in fluid molding compound, such as air traps and voids, and thereby to produce semiconductor packages free from molding defects. The object of the present invention can be accomplished by minimizing the amount of air introduced into the runner during the molding process by employing a cull-block with a cylindrical protrusion.

In an embodiment of the present invention, a transfer molding apparatus comprises a mold body and plungers. The mold body is composed of a upper mold die and a lower mold die. When both dies are properly aligned and placed, cavities, runners, air vents and pots are formed inside the mold body. Cull-blocks are inserted into the upper mold die so that the cull blocks face the upper surface of the plungers. The cull-block has a cylindrical protrusion at the center of the cull-block and a circular sunken part along the perimeter of the protrusion.

BRIEF DESCRIPTION OF THE DRAWINGS

These and various other features and advantages of the present invention will be readily understood with reference to the following detailed description taken in conjunction with the accompanying drawings. In the drawings, like reference numerals designate like structural elements, and, in which.

DETAILED DESCRIPTION OF THE INVENTION

The present invention will now be described in more detail hereinafter with reference to the accompanying drawings, in which an embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art.

A transfer molding apparatus according to the present invention comprises a mold body, plungers and cull-blocks having cylindrical protrusion and circular sunken part. The mold body is composed of a lower mold die and an upper mold die. When being aligned and placed properly, these upper and lower mold dies form a runners, cavities and air vents between the two dies. Runners are in communication with cavities, and the air vents are located on the side of the cavity opposite to the runners. In molding process, lead frame strips are placed between the upper mold die and the lower mold die, and the part of lead frame having semiconductor devices thereon is contained in the cavities.

The transfer molding apparatus according to the present invention will be explained in more detail with reference to the accompanying drawings.

Figure 2:
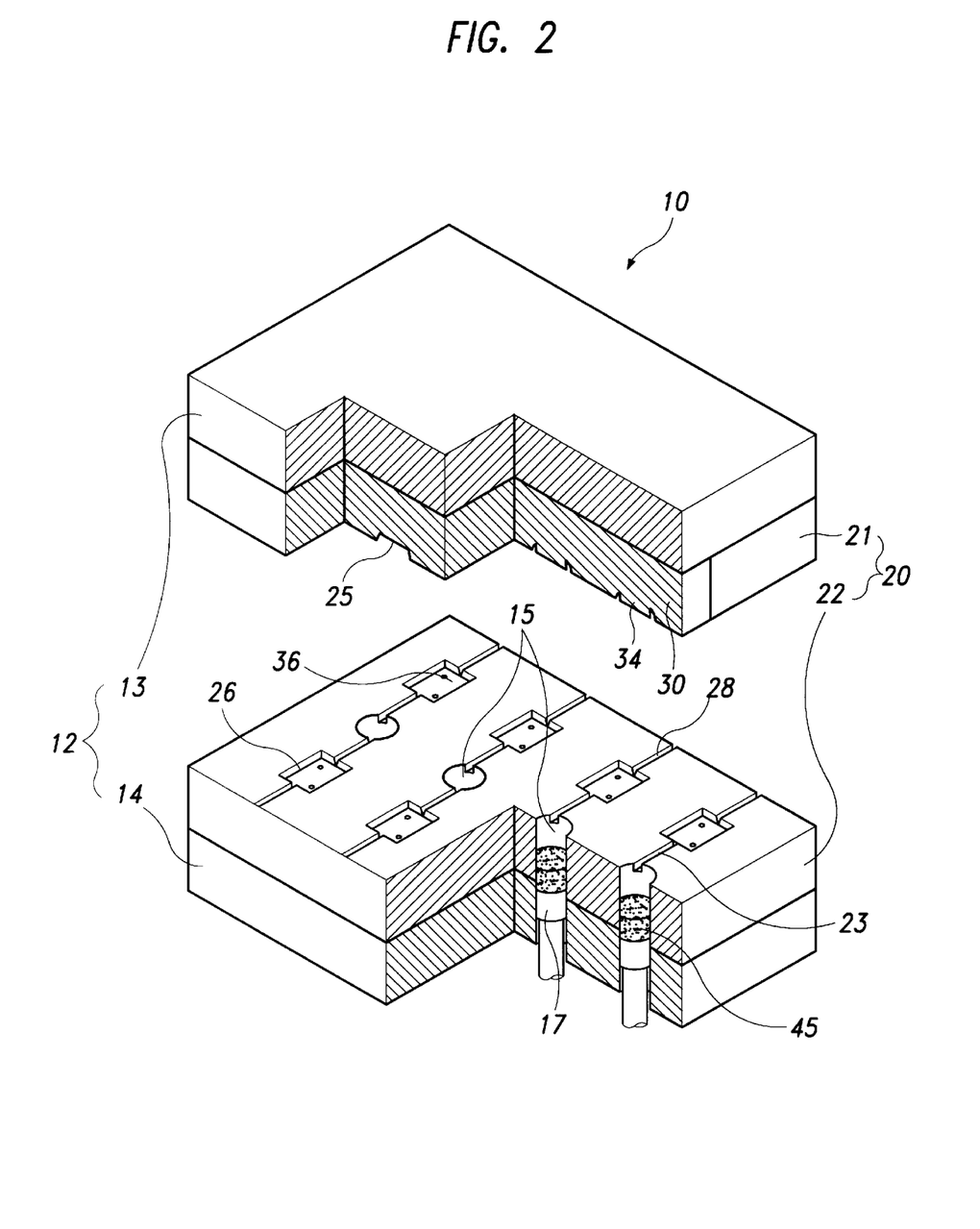
FIG. 2 is a diagram depicting a transfer molding apparatus according to the present invention.

FIG. 2 is a diagram depicting a transfer molding apparatus according to the present invention, which has a plurality of plungers With reference to FIG. 2, the transfer molding apparatus 10 of the present invention is composed of three parts: supporting plates 12 comprising an upper plate 13 and a lower plate 14; a mold body 20 comprising an upper mold die 21 and a lower mold die 22; and plungers 17.

The upper plate 13 and the lower plate 14 hold the upper mold die 21 and the lower mold die 22, respectively. The plates 13 and 14 include heaters (not shown) to heat the mold body 20 to a predetermined elevated temperature.

The lower mold die 22 includes pots 15, a plurality of lower cavities 36, runners 23 and air vents 28. The pot 15 provides a space for containing molding compound tablets 45 and a path for the plunger 17 to move. In the embodiment shown in FIG. 2, two lower cavities 26 are connected to each pot 15 via runners 23. The lower mold die 22 usually have a plurality of pots 15 and lower cavities 26. Air vents 28 are located on the side of the cavity opposite to the runners 23 and open to outside to provide an exit for the air inside the mold body 20. The lower mold die 22 also includes eject pins 36 for facilitating ejection of semiconductor device packages from the lower cavities 26.

The upper mold die 21 has a plurality of upper cavities 25 and cull-blocks 30. Each upper cavity 25 is matched to each corresponding lower cavity 26. The cull-blocks 30 are placed so that each cull-block 30 faces each corresponding pot 15. Cull-block 30 has a protrusion 34. The cull-block 30 will be described below in more detail.

Figure 3:
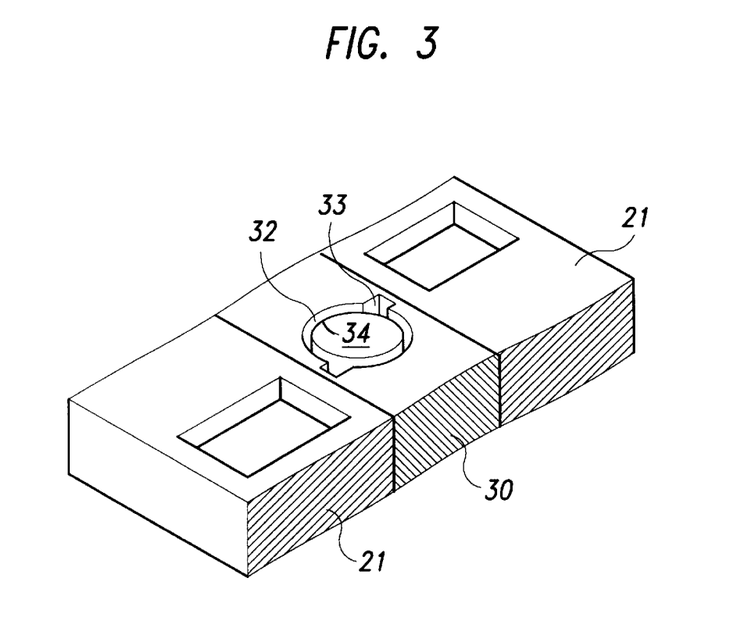
FIG. 3 is a perspective view showing the cull-block of the transfer molding apparatus according to the present invention.
Figure 4:
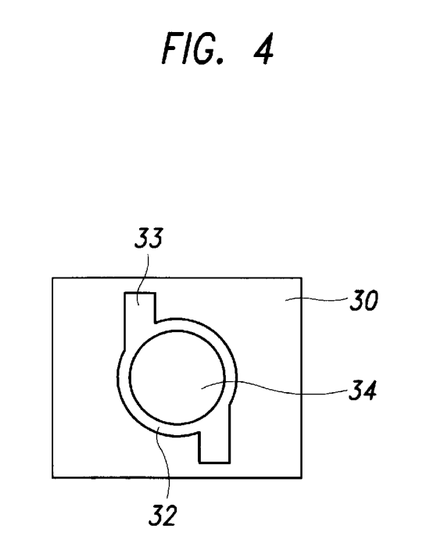
FIG. 4 is a plan view depicting the cull-block of the transfer molding apparatus according to the present invention.
Figure 5:
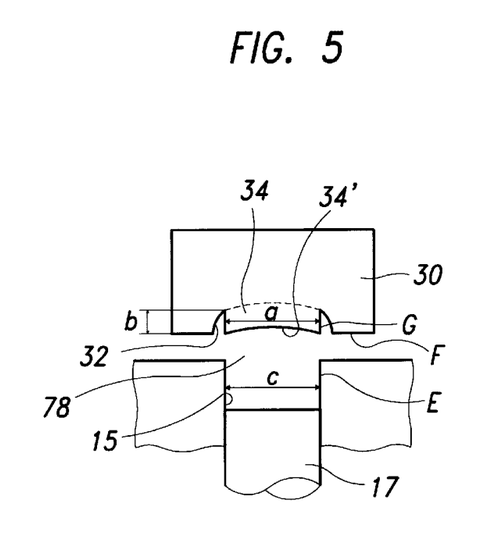
FIG. 5 is a cross-sectional view depicting the cull-block and the pot of the transfer molding apparatus according to the present invention.

FIG. 3 is a perspective view showing the cull-block 30 of the transfer molding apparatus 10 according to the present invention; FIG. 4 is a plan view depicting cull-block 30 of the transfer molding apparatus 10 according to the present invention; and FIG. 5 is a cross-sectional view depicting cull-block 30 and pot 15 of the transfer molding apparatus 10 according to the present invention. With reference to FIG. 3 through FIG. 5, the cull-block 30 has a cylindrical protrusion 34 at the center of the cull-block 30, and a circular sunken part 32 along the perimeter of the protrusion 34. The diameter of the protrusion 34, designated as '$a$', is the same as the inner diameter of the pot 15, designated as '$c$', and the outer surface line '$G$' of the protrusion 34 is at the same single vertical line as the inner surface line '$E$' of the pot 15, as shown in FIG. 5. The height '$b$' of the protrusion 34 may be determined so that the highest point of the protrusion 34 is at the same horizontal level as the upper surface '$F$' of the cull-block 30. The top of the protrusion 34 may also be below the upper surface line '$F$' of the cull-block 30. The upper surface 34' of the protrusion 34 may be concaved so as to minimize the contact area between the plunger 17 and the protrusion 34. This minimizing contact area may results in prolonged lifetime of the cull-block 30 and the plunger 17. The sunken part 32 also has indents 33 which are matched to the runners 23 in the lower mold die 22. The indents 33 allow easy and homogeneous flowing of the fluid molding compound into the runners 23.

The cull-block 30 is assembled into the upper mold die 21, and is detachable and replaceable. Different cull-blocks 30 are used for different types of semiconductor device package and molding compounds.

The operation of the transfer molding apparatus 10 will be explained with reference to FIG. 6a through FIG. 6c.

Figure 6A:
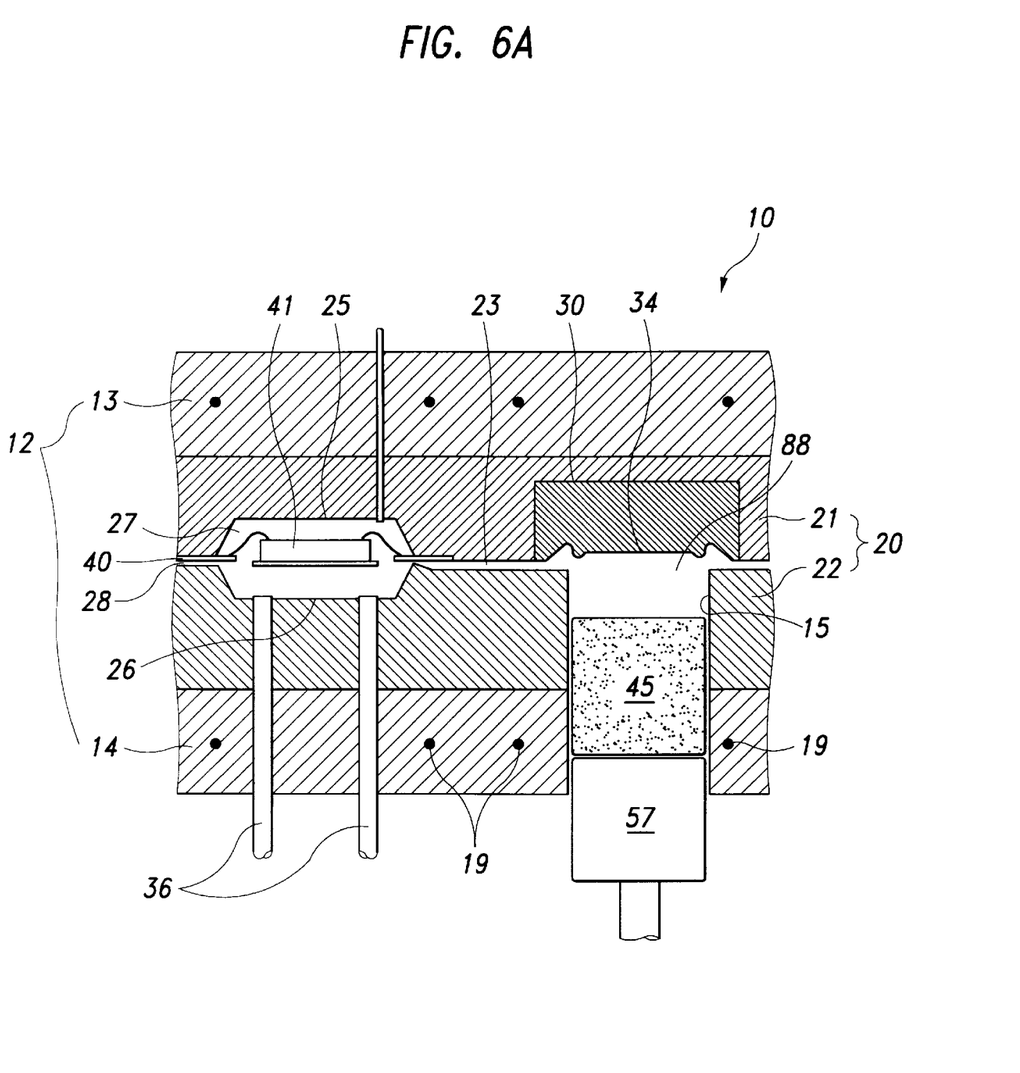
FIG. 6a to FIG. 6c are cross-sectional views depicting the steps of the transfer molding process using the transfer molding apparatus of the present invention.
Figure 6B:
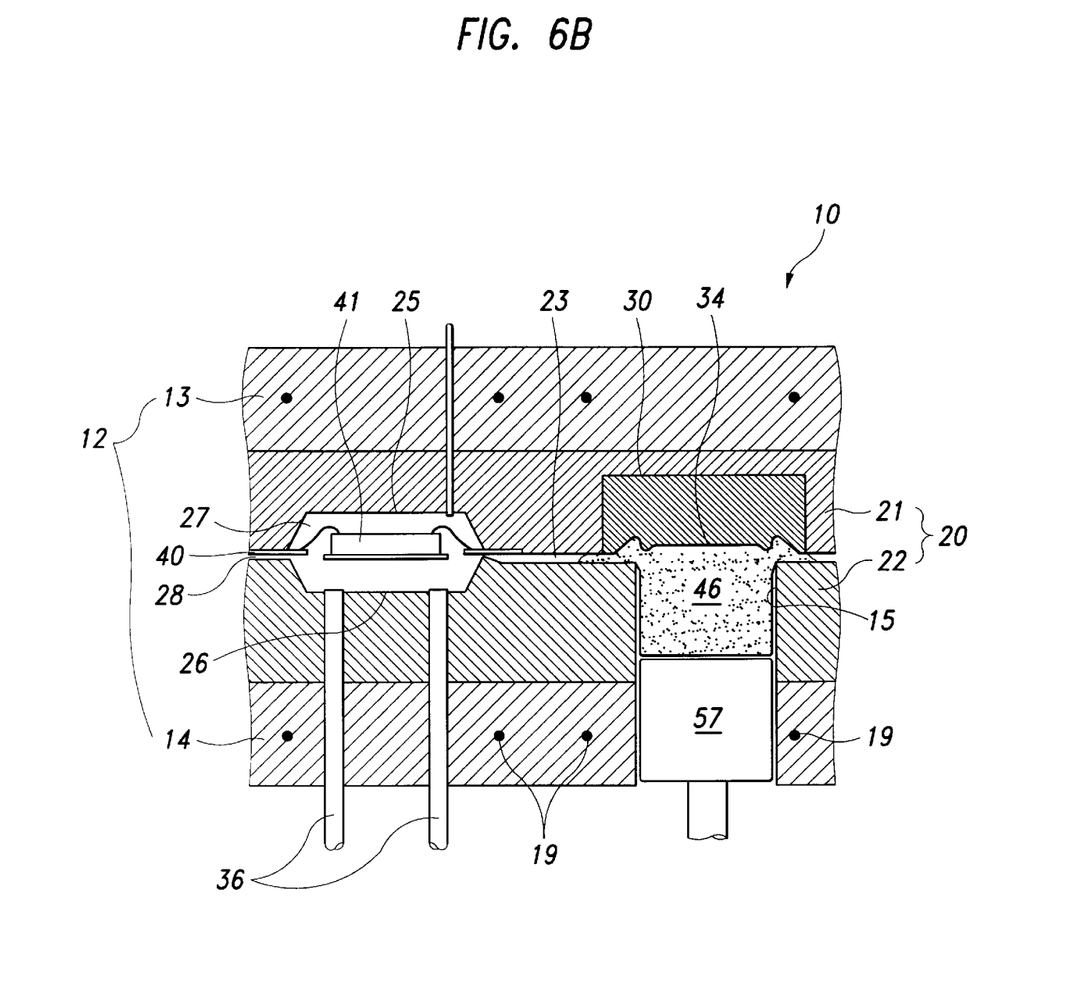
Figure 6C:
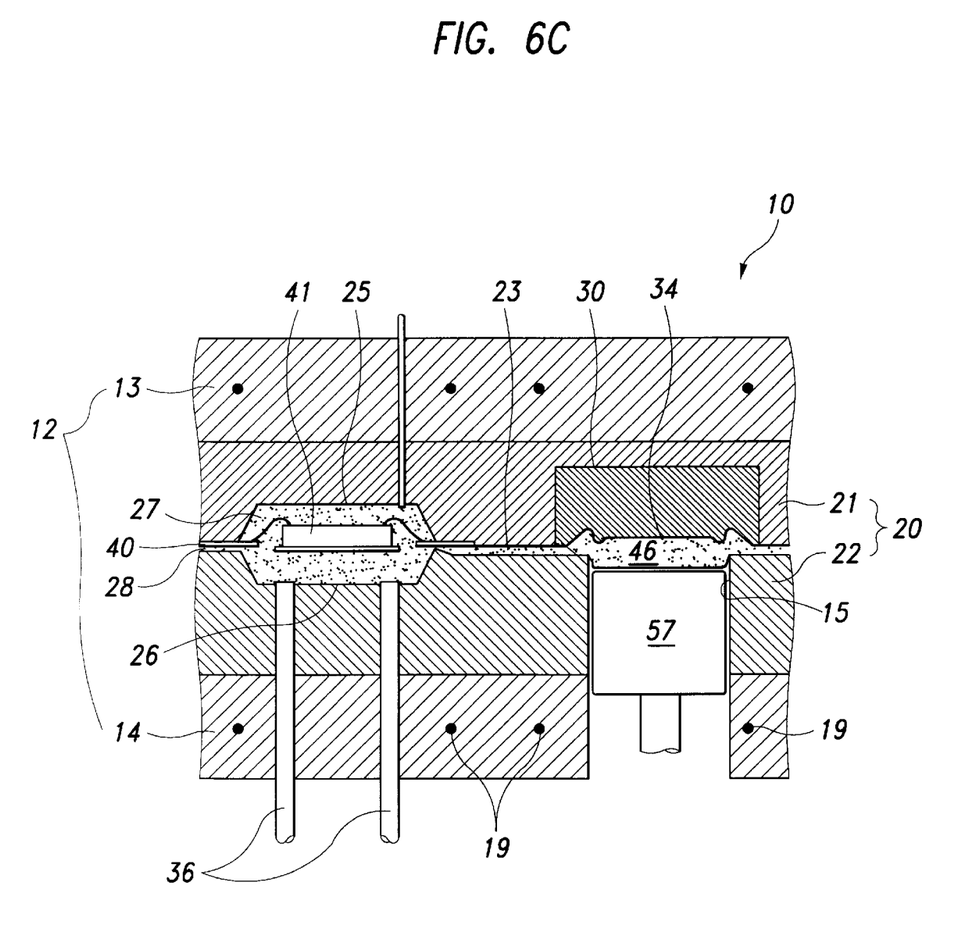

FIG. 6a to FIG. 6c are cross-sectional views depicting the steps of transfer molding process using the transfer molding apparatus 10 of the present invention. FIG. 6a shows the state before introducing molding compound into the runners and the cavities of the mold body, FIG. 6b shows the early state of the introduction of molding compound, and FIG. 6c shows the state after completing the introduction of molding compound into the mold body 20.

With reference to FIG. 6a, in the first place, molding compound tablets 45 are loaded to the pot 15 of lower mold die 22, and a lead frame 40 on which a semiconductor device is attached is loaded on the lower mold die 22. Then, the upper mold die 21 is aligned and placed on the lower mold die 22 to hold the lead frame 40, the semiconductor device 41 being contained inside the cavity 27 formed between the upper mold die 21 and the lower mold die 22.

Then, the upper mold die 21 and the lower mold die 22 are heated to a temperature of 170–180° C. by the heater 19 included in the upper plate 13 and the lower plate 14, and molding compound tablets 45 are transformed from solid state to fluid state.

Effectiveness of the cull-block 30 in the present invention can be explained with reference to FIG. 6b. The cull-block 30 has a cylindrical protrusion 34. Due to this protrusion 34, the space 88 in FIG. 6a between the pot 15 and the cull-block 30 is smaller to the extent of the space occupied by the protrusion 34 than the space 78 in FIG. 1a. Therefore, the amount of air present in the space 88 is smaller than that in the space 78.

With reference to FIG. 6b, when the molding compound 46 in the pot becomes a fluid, the plunger 57 moves upward to push up the fluid molding compound 46. Then, the fluid molding compound 46 collides with the protrusion 34 of the cull-block 30 and flows into the runners 23, not leaving such air gaps 47 as shown in FIG. 1b. Since the collision of the fluid molding compound 46 with cull-block 30 occurs before fluid molding compound 46 starts to flow into the runners 23, the runners 23 are not filled with the fluid molding compound 46 until a considerable amount of air in the space 88 is removed through the air vent 28. As the fluid molding compound 46 moves forward through the runner 23, the air in the runner 23 and the cavity 27 is removed through the air vent 28.

With reference to FIG. 6c, the fluid molding compound 46 encapsulates the semiconductor device 41 and a part of the lead frame 40. Since the air in the cavity 27 is removed through the air vent 28 before the cavity 27 is completely filled with fluid molding compound 46, a semiconductor device package free from molding defects is produced. The semiconductor device package is usually cured to solid state in the transfer molding apparatus 10. After curing, the upper mold die 21 is opened and the semiconductor device package is released from the lower mold die 22 by the ejector pins 36 that push the semiconductor device package upward.

In summary, the transfer molding apparatus according to the present invention effectively reduces the amount of air remaining in fluid molding compound during molding process by employing a cull-block with a protrusion. The protrusion not only reduces the amount of air present inside mold body to the extent of the space occupied by the protrusion, but also makes a collision with fluid molding compound before the fluid molding compound starts to flow into runners and prevents the formation of air gaps behind the front of fluid molding compound that moves through the runners.

Moreover, substantial removal of the air included in fluid molding compound allows uniform molding pressure during molding process and consequently improves the fluidity of fluid molding compound. The improvement of fluidity of molding compound can prevent the occurrence of air vent clogging.

Although an embodiment of the present invention has been described in detail herein above, it should be clearly understood that many variations and/or modifications of the basic inventive concepts herein taught which may appear to those skilled in the art will still fall within the spirit and scope of the present invention as defined in the appended claims.

What is claimed is:

1. A transfer molding apparatus for encapsulating semiconductor device packages, which comprises:
    a mold body comprising: an upper mold die; a lower mold die; a cull-block that has a protrusion with a cylindrical shape facing a pot, the cull-block having a sunken part around the protrusion, the pot being formed to contain a molding compound tablet in the beginning of molding process; and
    a plunger which moves to push up the molding compound in the pot.

2. A transfer molding apparatus according to claim 1 which has multiple pots and multiple cull-blocks.

3. A transfer molding apparatus according to claim 1, wherein top of the protrusion has a concave surface facing the pot.

4. A transfer molding apparatus according to claim 1, wherein the diameter of the protrusion is the same as that of inner wall of the pot.

5. A transfer molding apparatus according to claim 1, wherein the upper mold die and the lower mold die form a runner, a cavity and an air vent between the two dies.

6. A transfer molding apparatus according to claim 1, wherein the upper mold die and the lower mold die form a plurality of runners, cavities and air vents between the two dies.

7. A transfer molding apparatus according to claim 1, wherein the sunken part of the cull-block has an indent.

8. A transfer molding apparatus according to claim 1, wherein the sunken part of the cull-block has a plurality of indents.

9. A transfer molding apparatus according to claim 8, wherein the number of the indents is the same as that of the runners.

10. A transfer molding apparatus according to claim 7 or 8, wherein each indent is formed at a position facing a part of a runner close to the pot.

11. A transfer molding apparatus according to claim 8, wherein the indents are located with uniform angular intervals around the protrusion.

12. A transfer molding apparatus according to claim 1 or 2, wherein the top of the protrusion is below the surrounding upper surface line of the cull-block.

13. A transfer molding apparatus according to claim 1 or 2, wherein the pot is formed at the lower mold die and the cull-block is formed at the upper mold die.

14. A transfer molding apparatus according to claim 1 or 2, wherein the top of the protrusion is at the same height as the surrounding upper surface of the cull-block.

15. A transfer molding apparatus according to claim 1 or 2, wherein the surface line of the protrusion is at the same single vertical line as the inner surface line of the pot.

16. A transfer molding apparatus according to claim 1 or 2, wherein the cull-block is detachable from the mold body.

17. A transfer molding apparatus according to claim 1 or 2, wherein the top of the protrusion is below the surrounding upper surface line of the cull-block.

18. A transfer molding apparatus according to claim 1 or 2, wherein the mold body is of a center gate type.

19. A transfer molding apparatus for encapsulating semiconductor device packages, which comprises:
    a mold body comprising: an upper mold die; a lower mold die; a cull-block that has a protrusion facing a pot, the pot being formed to contain a molding compound tablet in the beginning of molding process, wherein the protrusion has a cylindrical shape with a concave surface facing the pot; and
    a plunger which moves to push up the molding compound in the pot.

20. A transfer molding apparatus according to claim 19 which has multiple pots and multiple cull-blocks.

21. A transfer molding apparatus according to claim 19, wherein the diameter of the protrusion is the same as that of inner wall of the pot.

* * * * *